(12) United States Patent
Song et al.

(10) Patent No.: US 8,049,245 B2
(45) Date of Patent: Nov. 1, 2011

(54) ORGANIC LIGHT EMITTING APPARATUS AND METHOD OF MANUFACTURING THE SAME

(75) Inventors: Seung-Yong Song, Yongin (KR); Kwan-Hee Lee, Yongin (KR); Young-Seo Choi, Yongin (KR); Oh-June Kwon, Yongin (KR); Sun-Young Jung, Yongin (KR); Ji-Hun Ryu, Yongin (KR); Young-Cheol Joo, Yongin (KR)

(73) Assignee: Samsung Mobile Display Co., Ltd. (KR)

( * ) Notice: Subject to any disclaimer, the term of this patent is extended or adjusted under 35 U.S.C. 154(b) by 139 days.

(21) Appl. No.: 12/512,707

(22) Filed: Jul. 30, 2009

(65) Prior Publication Data
US 2010/0148157 A1    Jun. 17, 2010

(30) Foreign Application Priority Data

Dec. 17, 2008    (KR) .......................... 10-2008-0128612

(51) Int. Cl.
*H01L 33/00* (2010.01)
(52) U.S. Cl. .... 257/99; 257/100; 257/103; 257/E33.059
(58) Field of Classification Search .................... 257/99, 257/100, 103, E33.059
See application file for complete search history.

(56) References Cited

U.S. PATENT DOCUMENTS

| | | | |
|---|---|---|---|
| 5,811,177 A | 9/1998 | Shi et al. | |
| 2010/0127246 A1* | 5/2010 | Nakayama et al. | 257/40 |
| 2010/0255619 A1* | 10/2010 | Kwon et al. | 438/34 |
| 2010/0295035 A1* | 11/2010 | Koyama | 257/40 |
| 2010/0295052 A1* | 11/2010 | Yamazaki et al. | 257/60 |

FOREIGN PATENT DOCUMENTS

| | | |
|---|---|---|
| JP | 185994 A | 7/1997 |
| JP | 2006228519 A | 8/2006 |
| JP | 2007042367 A | 2/2007 |
| KR | 10-2004-0073695 A | 8/2004 |

OTHER PUBLICATIONS

Korean Registration Determination Certificate of Patent for Invention Cert. No. 9-5-2010-0275439-85; issued Jun. 29, 2010.

* cited by examiner

*Primary Examiner* — Ngan Ngo
(74) *Attorney, Agent, or Firm* — Knobbe Martens Olson & Bear LLP

(57) ABSTRACT

This organic light emitting apparatus includes: a filling material between a diode substrate on which an organic light emitting unit is formed and an encapsulation substrate; and an organic protection layer that is interposed between the organic light emitting unit and the filling material and includes at least one thermally depositable organic material.

13 Claims, 5 Drawing Sheets

ORGANIC LIGHT EMITTING APPARATUS AND METHOD OF MANUFACTURING THE SAME

CROSS-REFERENCE TO RELATED PATENT APPLICATION

This application claims the benefit of Korean Patent Application No. 10-2008-0128612, filed on Dec. 17, 2008, in the Korean Intellectual Property Office, the disclosure of which is incorporated herein in its entirety by reference.

BACKGROUND OF THE INVENTION

1. Field of the Invention

The present embodiments relate to an organic light emitting apparatus and a method of manufacturing the same, and more particularly, an organic light emitting apparatus that includes: a filling material provided between a diode substrate on which an organic light emitting unit is formed and an encapsulation substrate; and an organic protection layer formed of at least one thermally depositable organic material and disposed between the organic light emitting unit and the filling material, and a method of manufacturing the same.

2. Description of the Related Art

Organic light emitting apparatuses each include at least one organic light emitting diode that is a self-emission diode. Organic light emitting diodes each include a pair of electrodes and an organic layer interposed between the electrodes, are lightweight, consist of a relatively small number of components, are easily manufactured, provide high image quality, and have wide viewing angles. Also, organic light emitting diodes provide high color purity, realize moving pictures well, have low power consumption, and operate at low voltage. Due to such electric characteristics, organic light emitting diodes are suitable for portable electric devices. Thus, organic light emitting apparatuses including such organic light emitting diodes are useful for portable thin flat panel display apparatuses.

Organic light emitting diodes deteriorate by inner factors such as deterioration of an emission layer caused by oxygen generated from ITO that forms an electrode, or deterioration caused by a reaction between the emission layer and an interface. Also, organic light emitting diodes easily deteriorate by external factors such as external humidity, external oxygen, external ultraviolet rays, or manufacturing conditions. External oxygen and humidity have a disadvantageous effect on lifetimes of organic light emitting diodes. Thus, when organic light emitting apparatuses are manufactured, packaging of organic light emitting diodes is very important. The present embodiments overcome the above problems as well as provide additional advantages.

SUMMARY OF THE INVENTION

The present embodiments provide an organic light emitting apparatus that includes a filling material interposed between a diode substrate, on which an organic light emitting unit is formed, and an encapsulation substrate, wherein the filling material does not damage the organic light emitting unit, and a method of manufacturing the same.

According to an aspect of the present embodiments, there is provided an organic light emitting apparatus including: a diode substrate; an organic emission unit that is disposed on the diode substrate and includes at least one organic light emitting diode including a pair of electrodes and an organic layer interposed between the electrodes; an encapsulation substrate disposed above the organic emission unit; a sealant with which the diode substrate is attached to the encapsulation substrate; a filling material interposed between the diode substrate and the encapsulation substrate; and an organic protection layer that is interposed between the organic emission unit and the filling material and includes at least one thermally depositable organic material.

According to another aspect of the present embodiments, there is provided a method of manufacturing an organic light emitting apparatus, wherein the method includes: forming on one surface of a diode substrate an organic light emitting unit that includes at least one organic light emitting diode including a pair of electrodes and an organic layer interposed between the electrodes; thermally depositing at least one thermally depositable organic material on the organic emission unit, thereby forming an organic protection layer; preparing an encapsulation substrate; providing a filling material and a sealant to at least one of the diode substrate on which the organic light emitting unit and the organic protection layer are formed and the encapsulation substrate; and combining the diode substrate with the encapsulation substrate.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION OF THE INVENTION

Exemplary embodiments will now be described in detail with reference to the attached drawings.

Figure 1:
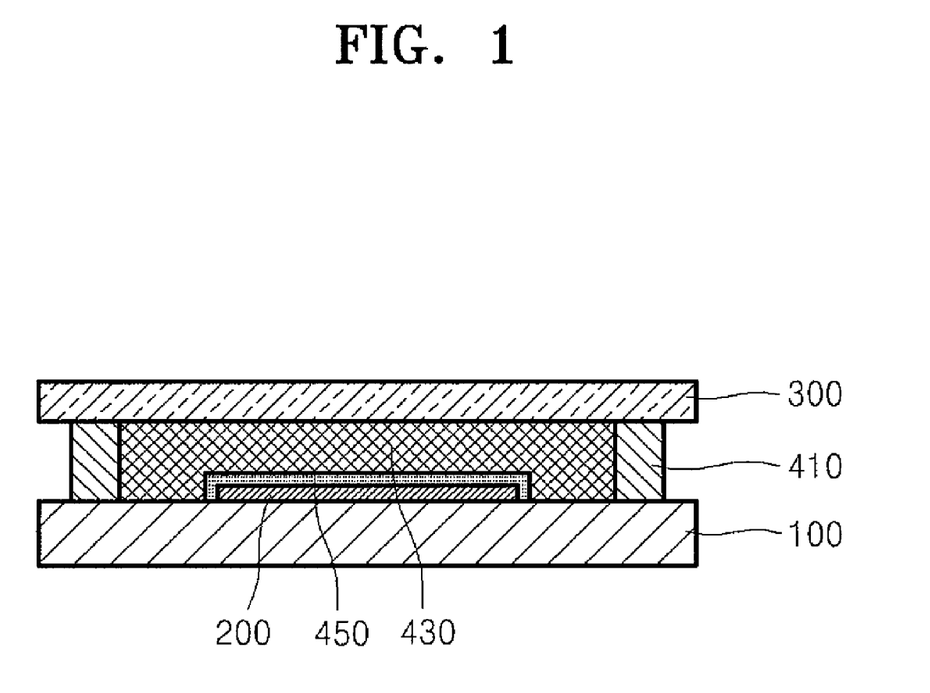
FIGS. 1 and 2 are schematic sectional views of an organic light emitting apparatus according to an embodiment.

FIG. 1 is a schematic sectional view of an organic light emitting apparatus according to an embodiment.

Referring to FIG. 1, the organic light emitting apparatus includes a diode substrate 100, an organic emission unit 200 disposed on the diode substrate 100, an encapsulation substrate 300 disposed above the organic emission unit 200, a sealant 410 with which the diode substrate 100 is attached to the encapsulation substrate 300, a filling material 430 interposed between the diode substrate 100 and the encapsulation substrate 300, and an organic protection layer 450 interposed between the organic emission unit 200 and the filling material 430.

The diode substrate 100 may be formed of an inorganic material such as a transparent glass material mainly formed of $SiO_2$, or an insulating organic material such as a transparent plastic material. The insulating organic material may be, for example, selected from the group consisting of polyethersulphone (PES), polyacrylate (PAR), polyetherimide (PEI), polyethylene naphthalate (PEN), polyethyeleneterephthalate (PET), polyphenylene sulfide (PPS), polyallylate, polyimide, polycarbonate (PC), cellulose triacetate (TAC), and cellulose acetate propionate (CAP), but is not limited to these materials.

If the organic light emitting apparatus illustrated in FIG. 1 is a bottom emission type apparatus and light emitted from the organic light emitting unit 200 propagates toward the diode substrate 100, the diode substrate 100 may be formed of a transparent material. However, if the organic light emitting apparatus illustrated in FIG. 1 is a top emission type apparatus and light emitted from the organic light emitting unit 200 propagates in the opposite direction to the diode substrate 100, the diode substrate 100 can, in some embodiments be formed of other materials. In the latter case, the diode substrate 100 may be formed of metal. If the diode substrate 100 is formed of metal, the diode substrate 100 may include at least one material selected from the group consisting of carbon, iron, chromium, manganese, nickel, titanium, molybdenum, stainless steel (SUS), Invar® alloy (ArcelorMittal, Luxembourg City, Luxembourg), Inconel® alloy (Special Metals Corporation, New Hartford, N.Y.), and Kovar® alloy (Carpenter Technology Corporation, Wyomissing, Pa.). However, the diode substrate 100 can also be formed of other materials. For example, the diode substrate 100 may be formed of metal foil.

Although not illustrated in FIG. 1, a buffer layer (not shown) for planarizing the diode substrate 100 and preventing permeation of impurity elements may be formed on the diode substrate 100.

The organic light emitting unit 200 may include at least one organic light emitting diode. The organic light emitting diode includes a pair of electrodes including a first electrode and a second electrode and an organic layer interposed between the electrodes.

The organic layer of the organic light emitting diode may include at least one layer selected from the group consisting of a hole injection layer (HIL), a hole transport layer (HTL), an emission layer, a hole blocking layer, an electron transport layer (ETL) and an electron injection layer.

The first electrode may be formed on the diode substrate 100, and may be an anode that comprises a hole injection electrode. The first electrode may be formed by depositing or sputtering a material having a high work function. A material that forms the first electrode may constitute a transmissible electrode or a reflective electrode. The material may comprise various types of electrodes. If the material comprises a transmissible electrode, the material may be ITO, IZO, ZnO, $In_2O_3$ or the like, for example. If the material comprises a reflective electrode, the reflective electrode may include a reflective film formed of Ag, Mg, Al, Pt, Pd, Au, Ni, Nd, Ir, Cr, etc. or any combination thereof, and a film that is formed of ITO, IZO, ZnO, $In_2O_3$ or the like and disposed on the reflective film.

The HIL may be formed using one or more of many methods such as a vacuum deposition method, a spin coating method, a cast method, or a Langmuir Blodgett (LB) method, for example. If the HIL is formed using a vacuum deposition method, deposition conditions may differ according to a compound selected for preparing a target layer, a target layer structure, and thermal characteristics, and for example, a deposition temperature may appropriately selected from about 100 to about 500° C., a degree of vacuum may appropriately selected from about $10^{-10}$ to about $10^{-3}$ torr, and a deposition speed may appropriately selected from about 0.01 to about 100 Å/sec. Meanwhile, if the HIL is formed using a spin coating method, coating conditions may differ according to a compound selected for preparing a target layer, a target layer structure, and thermal characteristics, and for example, a coating speed may be from about 2000 rpm to about 5000 rpm and a temperature at which a solvent used is removed after coating may from about 80° C. to about 200° C.

A HIL material may be any known hole injection material and may be, for example, a phthalocyanine compound such as copper phthalocyanine, 4,4',4"-tris (3-methylphenylphenylamino) triphenylamine (m-MTDATA), N,N'-di(1-naphthyl)-N,N'-diphenylbenzidine(NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), or (polyaniline)/poly(4-styrenesulfonate) (PANI/PSS), but is not limited thereto.

m-MTDATA

TDATA

2T-NATA

In some embodiments, the thickness of the HIL may be from about 10 Å to about 10000 Å, in a preferred embodiment, the thickness of the HIL may be from about 100 Å to about 1000 Å. If the thickness of the HIL is less than about 10 Å, hole injection characteristics may be degraded. On the other hand, if the thickness of the HIL is greater than about 10000 Å, the driving voltage of the organic light emitting device may be increased.

The HTL may be formed using a one or more of many methods such as a vacuum deposition method, a spin coating method, a cast method, or a LB method. In this regard, deposition conditions and coating conditions may differ according to a compound selected for preparing a target layer, a target layer structure, and thermal characteristics, but may be similar to those described with reference to the HIL.

A HTL material may be any known hole transport material, and may be, for example, a carbazole derivative such as N-phenylcarbazole or polyvinylcarbazole; an amine derivative having an aromatic condensation ring, such as N,N'-bis(3-methylphenyl)-N,N'-diphenyl-[1,1-biphenyl]-4,4'-diamine (TPD) or N,N'-di(naphthalene-1-yl)-N,N'-diphenyl benzidine (α-NPD); or a triphenylamine-based material, such as 4,4',4"-tris(N-arbazolyl)triphenylamine (TCTA). TCTA may have, in addition to a hole transporting capability, a capability of blocking diffusion of excitons generated in the emission layer.

α-NPD

TPD

In some embodiments, the thickness of the HTL may be from about 50 Å to about 1000 Å. In preferred embodiments, the thickness of the HTL may be from about 100 Å to about 600 Å. If the thickness of the HTL is less than about 50 Å, hole transporting characteristics may be degraded. On the other hand, if the thickness of the HTL is greater than about 1000 Å, the driving voltage of the organic light emitting device may be increased.

The emission layer may be formed using a method selected from various known methods such as a vacuum deposition method, a spin coating method, a cast method, or a LB method. In this regard, deposition conditions and coating conditions may differ according to a compound selected for preparing a target layer, a target layer structure, and thermal characteristics, but may be similar to those described with reference to the HIL.

The emission layer may include only a single light emission material. In some cases, however, the EML may include a host and a dopant.

The host may be, for example, tris(8-quinolate)aluminum (Alq$_3$), 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), or E3, but is not limited thereto.

TPBI

TBADN

E3

Meanwhile, a red dopant may be, for example, PtOEP, Ir(piq)$_3$, or Btp$_2$Ir(acac), but is not limited thereto.

PtOEP

Ir(ppy)₃

Ir(plq)₃

Btp₂Ir(acac)

Ir(ppy)₂(acac)    Ir(mpyp)₃

Also, a green dopant may be, for example, Ir(ppy)₃ (ppy=phenylpyridine), Ir(ppy)₂(acac), or Ir(mpyp)₃, but is not limited thereto.

A blue dopant may be, for example, F₂Irpic, (F₂ppy)₂Ir (tmd), Ir(dfppz)₃, ter-fluorene, 4,4'-bis[4-(di-p-tolylamino)styryl]biphenyl (DPAVBi), or 2,5,8,11-tetra-tert-butyl perylene (TBP), but is not limited thereto.

F₂Irpic (F₂ppy)₂Ir(tmd)

Ir(dfppz)₃

DPAVBi

The thickness of the emission layer may be from about 100 Å to about 1.000 Å, preferably, from about 100 Å to about 600 Å. If the thickness of the emission layer is less than about 100 Å, emission characteristics of the emission layer may be degraded. On the other hand, if the thickness of the emission layer is greater than about 1000 Å, the driving voltage of the organic light emitting device may be increased.

A hole blocking layer may be farther formed on the emission layer. The hole blocking layer blocks triplet excitons or holes from diffusing into, for example, a cathode. The hole blocking layer may be one or more of many methods such as a vacuum deposition method, a spin coating method, a cast method, or an LB method. In this regard, deposition conditions and coating conditions may differ according to the compound selected for preparing a target layer, the target layer structure, and thermal characteristics, but may be similar to those described with reference to the HIL.

A hole blocking material may be any hole blocking material. For example, the hole blocking material may be an oxadiazole derivative, a triazole derivative, or a phenanthroline derivative.

The thickness of the hole blocking layer may be from about 50 Å to about 1000 Å, preferably from about 100 Å to about 300 Å. If the HBL is less than about 50 Å, hole blocking characteristics may be degraded. On the other hand, if the HBL is greater than about 1000 Å, the driving voltage of the organic light emitting device may be increased.

The ETL may be formed using one or more of many methods such as a vacuum deposition method, a spin coating method, a cast method, or a LB method. The ETL may be formed on the emission layer or the hole blocking layer. In this regard, deposition conditions and coating conditions may differ according to the compound selected for preparing a target layer, the target layer structure, and thermal characteristics, but may be similar to those described with reference to the HIL.

An ETL material may be any electron transporting material. For example, the ETL may be tris(8-quinolinolate)aluminum ($Alq_3$), TAZ, TPQ1, TPQ2, 4,7-diphenyl-1,10-phenanthroline (Bphen), BCP, $BeBq_2$, or BAlq:

Alq₃

TAZ

TPQ 1

TPQ 2

BPhen

BCP

BeBq2

BAlq

The thickness of the ETL may be from about 100 Å to about 1000 Å, specifically from about 200 Å to about 500 Å. If the thickness of the ETL is less than about 100 Å, electron transporting characteristics may be degraded. On the other hand, if the thickness of the ETL is greater than about 1000 Å, the driving voltage of the organic light emitting device may be increased. Among these electron transporting materials, BPhen has, in addition to an electron transporting capability, a hole blocking capability.

The electron injection layer may be formed on the ETL. An electron injection layer material may be any electron injection material such as, for example, LiF, NaCl, CsF, Li2O, or BaO. Deposition conditions for forming the electron injection layer may differ according to a compound selected for preparing a target layer, and may be similar to those described with reference to the HIL.

The thickness of the electron injection layer may be from about 1 Å to 100 Å, for example from about 5 Å to about 50 Å. If the thickness of the electron injection layer is in this range, satisfactory electron injection characteristics may be obtained without a substantial decrease in the driving voltage of the organic light emitting device.

The second electrode may act as a cathode (electron injection electrode), and may be formed using a metal having a relatively low work function, an alloy having a relatively low work function, an electrically conductive compound having a relatively low work function, and any mixtures thereof. Examples of the material for preparing the second electrode may include Li, Mg, Al, Al—Li, Ca, Mg—In, and Mg—Ag. In addition, for a top emission type light emitting diode, the second electrode may be a transmissible cathode formed of ITO or IZO.

The encapsulation substrate 300 may be disposed above the diode substrate 100 on which the organic light emitting unit 200 is formed. The encapsulation substrate 300 may be combined with the diode substrate 100 by using a sealant 410. The encapsulation substrate 300 may be, for example, a glass substrate, a plastic substrate formed of, for example, acryl, or a metal substrate.

The diode substrate 100 and the encapsulation substrate 300 may be combined with each other by using the sealant 410. The sealant 410 may be an organic material such as a curable resin or ultraviolet (UV) curable resin, for example, an epoxy resin. Alternatively, the sealant 410 may be an inorganic material such as sealing glass frit.

The filling material 430 may be disposed between the diode substrate 100 and the encapsulation substrate 300. For example, the filling material 430 may fill a space between the diode substrate 100 and the encapsulation substrate 300 and may prevent oxygen and/or humidity from permeating into the inside of the organic light emitting unit 200. The filling material 430 may be any filling material. For example, the filling material 430 may be an organic filling material such as a urethane-based resin, a methacrylate-based resin, an acryl-based resin, polyisoprene, a vinyl-based resin, an epoxy-based resin, and a cellulose-based resin; an inorganic filling material based on metal such as Si, Al, Ti, or Zr, or metal oxide; or an organic/inorganic composite filling material.

The urethane-based resin may be, for example, urethane acrylate, but is not limited thereto. The methacrylate-based resin may be, for example, propylene glycol methacrylate, or tetrahydrofurfuryl methacrylate, but is not limited thereto. The acrylate-based resin may be, for example, butylacrylate or ethylhexylacrylate, but is not limited thereto. The vinyl-based resin may be, for example, vinylacetate, or N-vinylpyrrolidone, but is not limited thereto. The epoxy-based resin may be, for example, cycloaliphatic epoxide, but is not limited thereto. The cellulose-based resin may be, for example, cellulose nitrate, but is not limited thereto.

If the filling material 430 is an inorganic filling material, the filling material 430 may include at least one of silicon, aluminum, titanium, zirconium, titania, silicon oxide, zirconia, alumina, and precursors thereof. For example, the filling material 430 may be a silicon-based gel, but is not limited thereto.

Also, the organic/inorganic composite filling material may be a material in which metal and non-metal such as silicon, aluminum, titanium, or zirconium is covalently linked to an organic moiety. For example, the organic/inorganic composite filling material may include at least one material selected from the group consisting of epoxy silane or a derivative thereof, vinyl silane or a derivative thereof, aminosilane or a derivative thereof, methacrylate silane, and partially cured reaction products thereof. Examples of the epoxy silane or a derivative thereof include 3-glycidoxypropyltrimethoxysilane and a polymer thereof. Examples of the vinyl silane or a derivative thereof include vinyltriethoxysilnae and a polymer thereof. Examples of the aminesilane or a derivative thereof include 3-Aminopropyltriethoxysilane and a polymer thereof. Examples of the methacrylate silane or a derivative thereof include 3-(trimethoxysilyl)propyl acrylate and a polymer thereof.

The filling material 430 as described above may be interposed between the diode substrate 100 and the encapsulation substrate 300. If the filling material 430 is a material having a low vapor pressure, outgassing may occur from the filling material 430 when the organic light emitting apparatus is manufactured and/or driven. Gas generated by the outgassing may damage the organic light emitting unit 200. Also, in some cases, the filling material 430 itself may include a trace amount of a solvent, and in this case, the solvent may contact the organic light emitting unit 200, that is, a cathode of an organic light emitting diode and thus, may damage the organic light emitting unit 200. If the filling material 430 itself is reactive with the organic light emitting unit 200, the filling material 430 may also damage the organic light emitting unit 200.

To protect the organic light emitting unit 200 from being damaged by the filling material 430, the organic protection layer 450 may be interposed between the organic light emitting unit 200 and the filling material 430. Herein, the organic protection layer 450 may be formed of at least one thermally depositable organic material. The organic protection layer 450 may be formed by depositing at least one thermally depositable organic material on the organic light emitting unit 200.

In the present specification, the term "thermally depositable organic material" refers to a material that can be formed in a layer by thermal deposition and has at least one organic moiety that is conventionally known to those skilled in the chemical art. Examples of such an organic moiety include an alkyl group, an alkenyl group, an alkynyl group, an alkoxy group, a cycloalkyl group, a hetercycloalkyl group, an aryl group, a heteroaryl group, and a heterocyclic group.

The thermally depositable organic material may be a material capable of being evaporated at a degree of vacuum from about $10^{-10}$ torr to about $10^{-3}$ torr at a temperature from about 100° C. to about 500° C. For example, the thermally depositable organic material may be, for example, a material capable of being evaporated at a degree of vacuum from about $10^{-8}$ torr to about $10^{-3}$ torr at a temperature from about 200° C. to about 400° C., but is not limited thereto. According to an embodiment, the thermally depositable organic material may be a material capable of being evaporated at a degree of vacuum of $10^{-7}$ torr at a temperature of 300° C.

According to an embodiment, at least a portion of the degree of vacuum and evaporation temperature ranges of the thermally depositable organic material, and the degree of vacuum and evaporation temperature ranges used when the organic layer included in at least one organic light emitting diode included in the organic light emitting unit 200 is formed by thermal decomposition may overlap each other. Accordingly, for example, the thermally depositable organic material may be selected from conventional materials that are used to manufacture an organic layer of an organic light emitting diode.

According to an embodiment, the thermally depositable organic material may include a material selected from a plurality of materials included in the organic layer included in at least one organic light emitting diode included in the organic light emitting unit 200.

For example, if the organic layer of at least one organic light emitting diode of the organic light emitting unit 200 includes an HIL, the organic protection layer 450 may include the HIL material.

Also, if the organic layer of at least one organic light emitting diode of the organic light emitting unit 200 includes an HTL, the organic protection layer 450 may include the HTL material.

Also, if the organic layer of at least one organic light emitting diode of the organic light emitting unit 200 includes an emission layer, the organic protection layer 450 may include the emission layer material.

Also, if the organic layer of at least one organic light emitting diode of the organic light emitting unit 200 includes a hole blocking layer, the organic protection layer 450 may include the hole blocking layer material.

Also, if the organic layer of at least one organic light emitting diode of the organic light emitting unit 200 includes an ETL, the organic protection layer 450 may include the ETL material.

Also, if the organic layer of at least one organic light emitting diode of the organic light emitting unit 200 includes an electron injection layer, the organic protection layer 450 may include the electron injection layer material.

In addition, the organic protection layer 450 may include a thermally depositable material that may be different from a material included in the organic layer of at least one organic light emitting diode of the organic light emitting unit 200 though, and may satisfy the degree of vacuum and evaporation temperature ranges as described above and can be formed in a layer by thermal deposition.

Herein, the thermally depositable organic material included in the organic protection layer 450 may not be a metal complex-type material. For example, the thermally depositable organic material included in the organic protection layer 450 may not be a metal complex-type phosphorescent dopant and a metal complex-type electron transport material (for example, Alq3). Not wishing to be bound by a particular theory, it appears that a metal material in the metal complex may react with a filling material and an organic protection layer including the metal complex may fail to perform a protection function. In addition, after charging, the filling material may be hardened through a thermal process or a UV process. In this case, however, the filling material that is reacted with the metal complex may not be hardened. Also, in general, a hardening initiator of the filling material may be, in most cases, a metal catalyst and the metal catalyst may react with other metal of the metal complex, and thus, the filling material may not be hardened.

According to an embodiment, the organic protection layer 450 may include a material selected from the group consisting of 4,4',4''-tris(3-methylphenylphenylamino)triphenylamine (m-MTDATA), N,N+-di(1-naphthyl)-N,N'-diphenyl-benzidine (NPB), TDATA, 2T-NATA, N,N'-bis(3-methylphenyl)N,N'-diphenyl-[1,1-biphenyl]-4,4'-diamine (TPD), N,N'-di(naphthalene-1-yl)-N,N'-diphenyl benzidine (α-NPD), 4,4',4''-tris(N-carbazolyl)triphenylamine (TCTA), 4,4'-N,N'-dicarbazole-biphenyl (CBP), 9,10-di(naphthalene-2-yl)anthracene(ADN), 1,3,5-tris(N-phenylbenzimidazole-2-yl)benzene (TPBI), 3-tert-butyl-9,10-di(naphth-2-yl)anthracene (TBADN), E3, ter-fluorene, 4,4'-bis[4-(di-p-tolylamino)styryl]biphenyl (DPAVBi), 2,5,8,11-tetra-tert-butyl perylene (TBP), TAZ, TPQ1, TPQ2, 4,7-diphenyl-1,10-phenanthroline (Bphen), and BCP. However, the organic protection layer may also include other materials.

The thickness of the organic protection layer 450 may be from about 200 Å to about 1200 Å, for example, from about 400 Å to about 1000 Å. If the thickness of the organic protection layer 450 is in this range, the organic protection layer 450 may be level and may effectively protect the organic light emitting unit 200 from being damaged by the filling material 430.

The organic protection layer 450 may have various structures. For example, the organic protection layer 450 may be formed of one kind of a thermally depositable material, may be a single layer including at least two different kinds of thermally depositable materials, or may have a multiple layered structure including at least two layers including at least two different kinds of thermally depositable materials.

Since the filling material 430 fills a space between the diode substrate 100 and the encapsulation substrate 300, external oxygen and/or humidity-caused damages on the organic light emitting unit 200 can be minimized.

Also, since the organic protection layer 450 covers the organic light emitting unit 200, the filling material-caused damages on the organic light emitting unit 200 can also be minimized.

Figure 2:
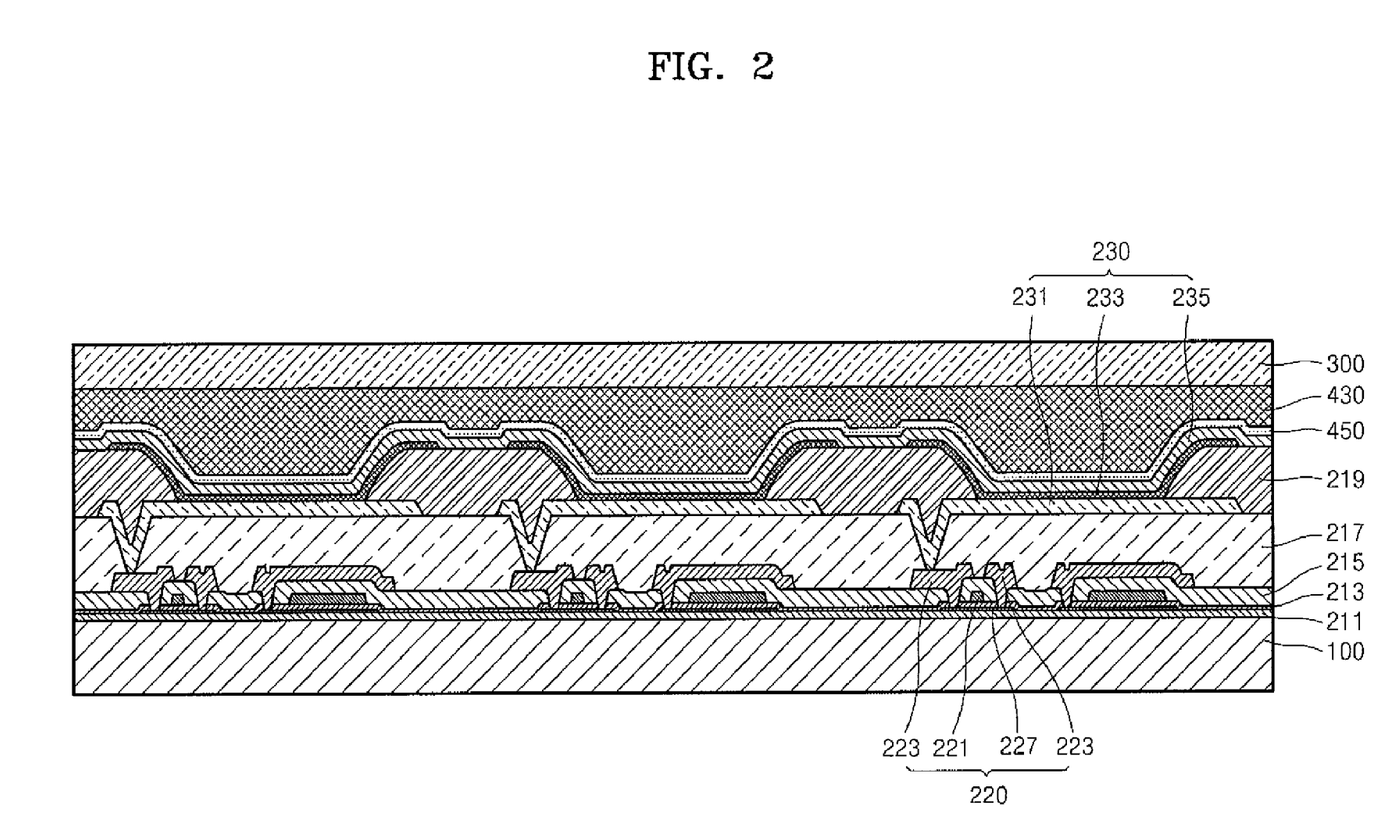

FIG. 2 is a schematic section view of a portion of the organic light emitting apparatus of FIG. 1, and exemplarily shows a detailed structure of the organic light emitting unit 200.

Referring to FIG. 2, a plurality of thin film transistors 220 are disposed on the diode substrate 100, and a plurality of organic light emitting diode 230 are disposed on the thin film transistors 220. Each of the organic light emitting diode 230 includes a pixel electrode 231 electrically connected to the corresponding thin film transistor 220, an opposite electrode 235 disposed on the entire surface of the diode substrate 100, and an organic layer 233 interposed between the pixel electrode 231 and the opposite electrode 235.

Each of the thin film transistors 220 disposed on the diode substrate 100 includes a gate electrode 221, source and drain electrodes 223, a semiconductor layer 227, a gate insulating layer 213, and an interlayer insulating layer 215. The structure of the thin film transistor 220 may not be limited to that illustrated in FIG. 2 and may be selected from various thin film transistors. For example, the thin film transistor 220 may be an organic thin film transistor in which the semiconductor layer 227 is formed of an organic material, or a silicon thin film transistor in which the semiconductor layer 227 is formed of silicon. If necessary, a buffer layer 211 formed of silicon oxide or silicon nitride may be formed between the thin film transistor 220 and the diode substrate 100.

The organic light emitting diode 230 may include the pixel electrode 231, the opposite electrode 235 facing the pixel electrode 231, and the organic layer 233 interposed between the pixel electrode 231 and the opposite electrode 235. The pixel electrode 231 may act as an anode, and the opposite electrode 235 may act as a cathode. In other embodiments, however, the pixel electrode 231 may act as a cathode and the opposite electrode 235 may act as an anode.

A pixel defining layer 219 (PDL) covers an edge portion of the pixel electrode 231 and may have a thickness outside the pixel electrode 231. The pixel defining layer 219 defines an emission region, and widens an interval between the edge portion of the pixel electrode 231 and the opposite electrode 235 to prevent an electric field from being focused in the edge portion of the pixel electrode 231, thereby preventing short circuits between the pixel electrode 231 and the opposite electrode 235.

The organic layer 233 may be formed between the pixel electrode 231 and the opposite electrode 235. Detailed descriptions of the organic layer 233 have already been described.

The organic light emitting diode 230 may be electrically connected to the thin film transistor 220 disposed therebelow. In this case, if a planarization layer 217 covering the thin film transistor 220 exists, the organic light emitting diode 230 may be disposed on the planarization layer 217, and the pixel electrode 231 of the organic light emitting diode 230 may be electrically connected to the thin film transistor 220 through a contact hole formed in the planarization layer 217.

Meanwhile, the organic light emitting diode 230 may be sealed by the encapsulation substrate 300. The encapsulation substrate 300 may be formed of, as described above, various materials such as glass or plastic materials.

Meanwhile, the filling material 430 may be disposed between the organic light emitting diode 230 and the encapsulation substrate 300 to fill the space between the organic light emitting diode 230 and the encapsulation substrate 300.

The organic protection layer 450 may be disposed between the organic light emitting diode 230 and the filling material 430. The organic protection layer 450 protects the organic light emitting diode 230 from being damaged by the filling material 430, and detailed descriptions about this have already been described.

A method of manufacturing an organic light emitting apparatus includes: forming on one surface of a diode substrate an organic light emitting unit that includes at least one organic light emitting diode including a pair of electrodes and an organic layer interposed between the electrodes; thermally depositing at least one thermally depositable organic material on the organic emission unit to form an organic protection layer; preparing an encapsulation substrate; providing a filling material and a sealant to at least one of the diode substrate on which the organic light emitting unit and the organic protection layer are formed and the encapsulation substrate; and combining the diode substrate with the encapsulation substrate.

FIGS. 3A to 3D are diagrams for sequentially explaining a method of manufacturing an organic light emitting apparatus according to an embodiment.

Figure 3A:
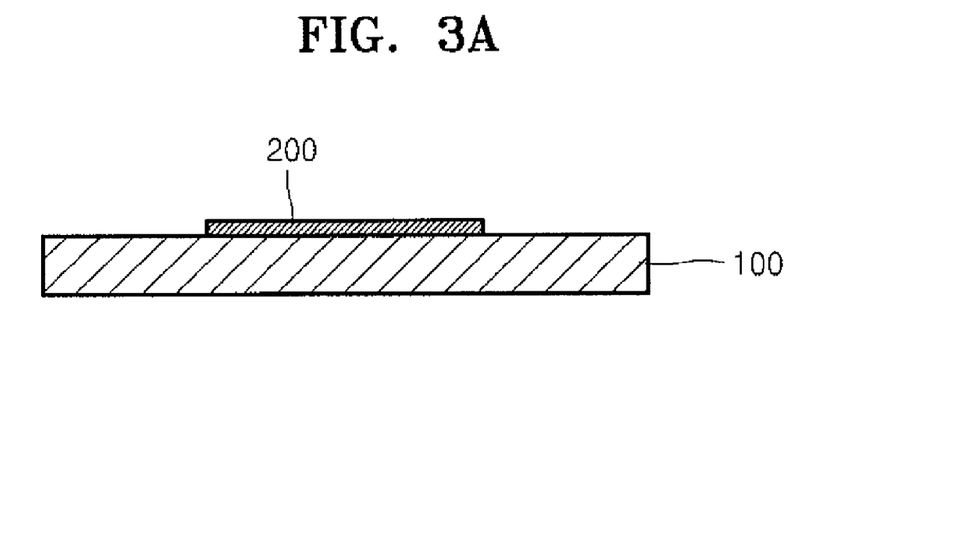
FIGS. 3A to 3D are diagrams for sequentially explaining a method of manufacturing an organic light emitting apparatus according to an embodiment.

First, as illustrated in FIG. 3A, an organic light emitting unit 200 is formed on a diode substrate 100.

Figure 3B:
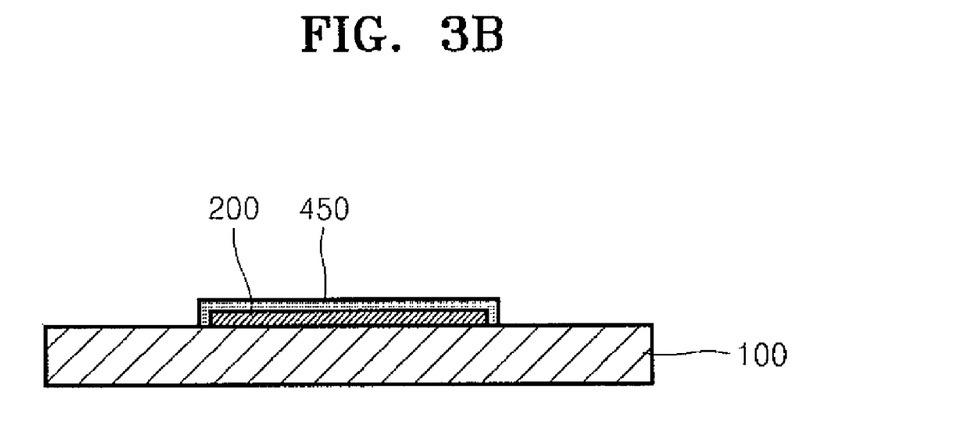

Then, as illustrated in FIG. 3B, at least one thermally depositable organic material is thermally deposited on the organic light emitting unit 200, thereby forming an organic protection layer 450. Detailed descriptions of the thermally depositable organic material have already been described.

Since the organic protection layer 450 is formed by thermal decomposition, when the organic protection layer 450 is formed, the organic light emitting unit 200 may not be damaged and the process time may be reduced.

Since the filling material 430 necessarily damages the organic light emitting unit 200, formation of a protection layer on the organic light emitting unit 200 is necessary. However, to form an inorganic protection layer formed of an inorganic material on the organic light emitting unit 200, a chemical vapor deposition (CVD) method that accompanies generation of plasma having a strong energy or a sputtering method are used. Thus, when the inorganic protection layer is formed, the organic light emitting unit 200 may be rather damaged. To prevent such damages, the inorganic protection layer may be formed by adjusting energy of the CVD or sputtering method at low levels. In this case, however, a tack time may necessarily increase in processes and thus the process costs may increase. If an organic protection layer is formed by coating with a curable material such as an acrylate-based resin, coating and heat treatment processes for forming a layer need to be performed. Thus, this method also leads to high manufacturing costs of an organic light emitting apparatus.

However, when the organic protection layer 450 is formed by thermally depositing the thermally depositable material, such problems can be resolved and also, a material for forming an organic layer used in at least one organic light emitting diode included in the organic light emitting unit 200 can be used a material for forming the organic protection layer 450, and a deposition chamber used for forming the organic layer can be re-used. Thus, the organic light emitting unit 200 may not be damaged and the process costs may be reduced.

Figure 3C:
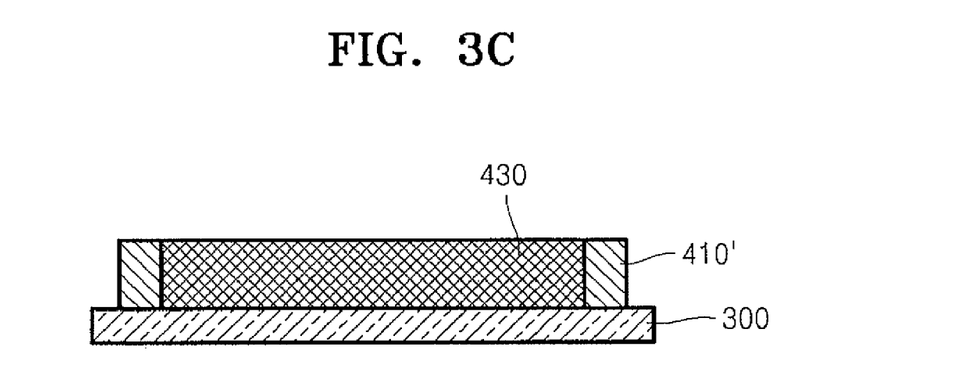
Figure 3D:
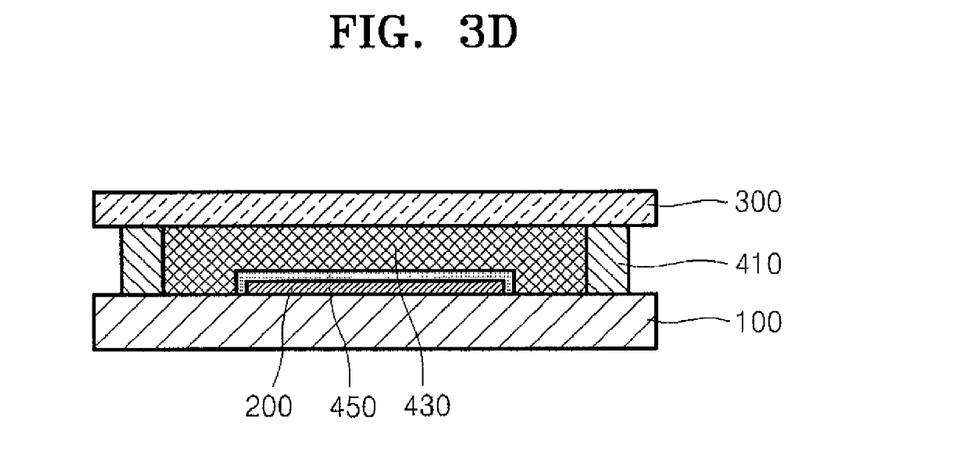

Then, as illustrated in FIG. 3C, an encapsulation substrate 300 is prepared and a filling material 430 and a sealant forming material 410' are supplied thereon.

Then, the diode substrate 100 illustrated in FIG. 3B and the encapsulation substrate 300 illustrated in FIG. 3C are arranged in such a way that the organic light emitting unit 200 is disposed between the diode substrate 100 and the encapsulation substrate 300, thereby combining the diode substrate 100 and the encapsulation substrate 300 by using the sealant 410. Thus, the organic light emitting unit 200 may be encapsulated. Herein, the sealant forming material 410' may be converted into a sealant by UV curing or heat treatment, and thus, the diode substrate 100 is combined with the encapsulation substrate 300.

Figure 4A:
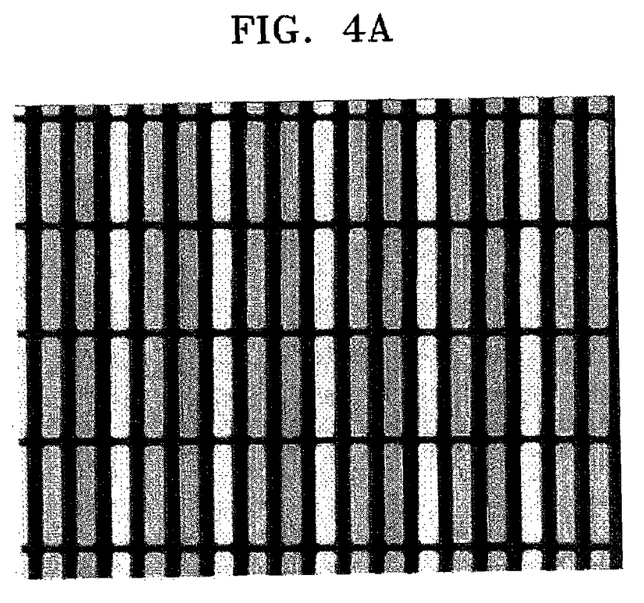
FIGS. 4A and 4B are emission photographs of an organic light emitting apparatus according to an embodiment and a conventional organic light emitting apparatus, respectively.

FIG. 4A shows an emission photograph of an organic light emitting apparatus according to an embodiment. The organic light emitting apparatus is manufactured in the following manner. An organic light emitting diode including a first electrode, an organic layer, and a second electrode is formed on a glass substrate as a diode substrate, and then, NPB is thermally deposited thereon at about $10^{-7}$ torr at about 300° C. to cover the organic light emitting diode, thereby forming an organic protection layer having a thickness of 700 Å. Then, an alkali-free substrate as an encapsulation substrate is prepared, and silicon-based gel as a filling material and an epoxy resin are supplied on the encapsulation substrate, and the diode substrate is combined with the encapsulation substrate and the epoxy resin is cured using UV.

Figure 4B:
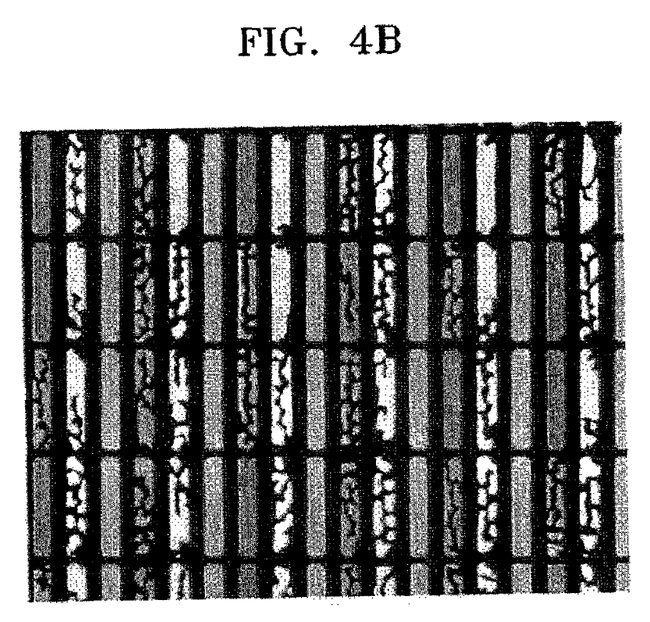

Meanwhile, FIG. 4B shows an emission photograph of an organic light emitting apparatus manufactured in the same manner as the method of manufacturing the organic light emitting apparatus as described above, except that the organic protection layer was not formed.

FIGS. 4A and 4B are emission photographs of the organic light emitting apparatuses after being driven at a temperature of about 85° C. for about 24 hours. Referring to FIGS. 4A and 4B, it can be seen that an organic light emitting apparatus according to an embodiment has an excellent, uniform emission state without black spots after driving, and thus has a long lifetime.

The organic light emitting apparatus described above includes: a filling material between a diode substrate on which an organic light emitting unit is formed and an encapsulation substrate; and an organic protection layer including at least one thermally depositable organic material between the organic light emitting unit and the filling material. Thus, the organic protection layer can protect the organic light emitting unit from being damaged by the filling material, thereby obtaining an organic light emitting apparatus having a long lifetime. Also, since the organic protection layer is formed by thermal decomposition, a material and equipment which are used to form an organic layer of the organic light emitting unit can be re-used. Thus, the manufacturing costs of the organic light emitting apparatus can be reduced.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:
1. An organic light emitting apparatus comprising:
a diode substrate;
an organic emission unit that is disposed on the diode substrate and comprises at least one organic light emitting diode comprising a pair of electrodes and an organic layer interposed between the electrodes;
an encapsulation substrate disposed above the organic emission unit;
a sealant with which the diode substrate is attached to the encapsulation substrate;
a filling material interposed between the diode substrate and the encapsulation substrate; and
an organic protection layer that is interposed between the organic emission unit and the filling material and comprises at least one thermally depositable organic material.

2. The organic light emitting apparatus of claim 1, wherein the thermally depositable organic material comprises a material capable of being evaporated at a degree of vacuum from about $10^{-10}$ torr to about $10^{-3}$ torr at a temperature from about 100° C. to about 500° C.

3. The organic light emitting apparatus of claim 1, wherein the thermally depositable organic material comprises one material selected from a plurality of materials comprised in the organic layer of the organic light emitting diode.

4. The organic light emitting apparatus of claim 1, wherein the organic layer of the organic light emitting diode comprises a hole injection layer, and the organic protection layer comprises a material for forming the hole injection layer.

5. The organic light emitting apparatus of claim 1, wherein the organic layer of the organic light emitting diode comprises a hole transport layer, and the organic protection layer comprises a material for forming the hole transport layer.

6. The organic light emitting apparatus of claim 1, wherein the organic layer of the organic light emitting diode comprises an emission layer, and the organic protection layer comprises a material for forming the emission layer.

7. The organic light emitting apparatus of claim 1, wherein the organic layer of the organic light emitting diode comprises a hole blocking layer, and the organic protection layer comprises a material for forming the hole blocking layer.

8. The organic light emitting apparatus of claim 1, wherein the organic layer of the organic light emitting diode comprises an electron transport layer, and the organic protection layer comprises a material for forming the electron transport layer.

9. The organic light emitting apparatus of claim 1, wherein the organic layer of the organic light emitting diode comprises an electron injection layer, and the organic protection layer comprises a material for forming the electron injection layer.

10. The organic light emitting apparatus of claim 1, wherein the organic protection layer comprises at least one material selected from the group consisting of 4',4"-tris(3-methylphenylamino) triphenylamine (m-MTDATA), N,N'-di(1-naphthyl)-N,N'-diphenylbenzidine (NPB), TDATA, 2T-NATA, N,N'-bis(3-methylphenyl)-N,N'-diphenyl-[1,1-biphenyl]-4,4'-diamine (TPD), N,N-di(naphthalene-1-yl)-N,N'-diphenyl benzidine (α-NPD), 4,4',4"-tris(N-carbazolyl)triphenylamine (TCTA), 4,4'-N,N'-dicarbazole-biphenyl (CBP), 9,10-di(naphthalene-2-yl)anthracene(ADN), 1,3,5-tris(N-phenylbenzimidazole-2-yl)benzene (TPBI), 3-tert-butyl-9,10-di(naphth-2-yl)anthracene (TBADN), E3, ter-fluorene, 4,4'-bis[4-(di-p-tolylamino)staryl] biphenyl (DPAVBi), 2,5,8,11-tetra-tent-butyl perylene (TBP), TAZ, TPQ1, TPQ2,4,7-diphenyl-1,10-phenanthroline (Bphen), BCP and mixtures thereof.

11. The organic light emitting apparatus of claim 1, wherein the thickness of the organic protection layer is from about 200 Å to about 1200 Å.

12. The organic light emitting apparatus of claim 1, wherein the filling material fills a space between the diode substrate and the encapsulation substrate.

13. The organic light emitting apparatus of claim 1, wherein the organic protection layer covers the organic light emitting unit, and the filling material covers the organic protection layer.

* * * * *